US010104801B2

(12) United States Patent
Bailey et al.

(10) Patent No.: US 10,104,801 B2
(45) Date of Patent: Oct. 16, 2018

(54) METHOD TO SELECTIVELY ACTIVATE POWER OUTLETS IN A FLEXIBLE AND SCALABLE POWER AND SYSTEM MANAGEMENT INFRASTRUCTURE FOR A DATA MANAGEMENT SYSTEM

(71) Applicant: DELL, INC., Round Rock, TX (US)

(72) Inventors: Edmond Bailey, Cedar Park, TX (US); John R. Stuewe, Round Rock, TX (US); Kunrong Wang, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 71 days.

(21) Appl. No.: 14/139,783

(22) Filed: Dec. 23, 2013

(65) Prior Publication Data

US 2015/0177806 A1    Jun. 25, 2015

(51) Int. Cl.
*G06F 1/26* (2006.01)
*H05K 7/14* (2006.01)

(52) U.S. Cl.
CPC .................................. *H05K 7/1492* (2013.01)

(58) Field of Classification Search
None
See application file for complete search history.

(56) References Cited

U.S. PATENT DOCUMENTS

| | | | | |
|---|---|---|---|---|
| 7,141,891 | B2 * | 11/2006 | McNally | G06F 1/206 307/39 |
| 2007/0049133 | A1 * | 3/2007 | Conroy | G06F 1/26 439/894 |
| 2008/0309164 | A1 * | 12/2008 | Lim | H01R 13/6641 307/39 |
| 2010/0079001 | A1 * | 4/2010 | Lee | G06F 1/266 307/40 |
| 2010/0176658 | A1 * | 7/2010 | Lai | G06F 1/266 307/39 |
| 2010/0280774 | A1 * | 11/2010 | Ewing | H04Q 9/00 702/60 |
| 2011/0018688 | A1 * | 1/2011 | Hanada | H04L 12/40013 340/10.1 |
| 2011/0043034 | A1 * | 2/2011 | Pien | H02J 3/14 307/38 |
| 2014/0312691 | A1 * | 10/2014 | Doljack | H02J 7/0036 307/29 |

\* cited by examiner

*Primary Examiner* — Paul Yanchus, III
(74) *Attorney, Agent, or Firm* — Isidore PLLC (57) ABSTRACT

A power switching system, a method, and an information handling system (IHS) enables selective activation and de-activation of respective alternating current (AC) outlets of a plurality of AC outlets within an AC switch (ACS). The AC switch includes a decoder circuit that is couple via a control interface to a management controller (MC) and receives control commands from the control interface. In response to receipt of the control command, the decoder circuit decodes the command in order to provide control signals to one or more of a number of serial voltage relays, which are each respectively coupled to the AC outlets. The AC switch utilizes the decoder circuit to respectively configure the serial voltage relays using the control signals. By configuring the serial voltage relays, the MC provides and/or removes respective connections between AC inputs and AC outlets, which selectively activates and/or de-activates respective AC outlets.

19 Claims, 6 Drawing Sheets

METHOD TO SELECTIVELY ACTIVATE POWER OUTLETS IN A FLEXIBLE AND SCALABLE POWER AND SYSTEM MANAGEMENT INFRASTRUCTURE FOR A DATA MANAGEMENT SYSTEM

BACKGROUND

1. Technical Field

The present disclosure generally relates to information handling systems and in particular to power management for information handling systems.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Rack-based information handling systems enable larger scale systems to be deployed in a single structure called a rack. These racks can hold a plurality of individual servers or server nodes, which can be fully functional units, with individual cooling and power controls and separate management of each processing node.

Providing power management to an information handling system is important to prevent loss of data and to maintain system reliability. During operation of an information handling system, events can occur that interrupt or reduce the amount of incoming AC power to the information handling system or the amount of available power from power supplies that deliver electrical power to the information handling system. It is desirable for the information handling system to be able to seamlessly manage both increases and decreases in power demands from the components of the information handling system and to be able to manage interruptions in the delivery of power to the information handling system.

BRIEF SUMMARY

Disclosed are a power switching system, a method, and an information handling system (IHS) that enables selective activation and de-activation of respective alternating current (AC) outlets of a plurality of AC outlets within an AC switch. The AC switch includes a decoder circuit that is communicatively coupled via a control interface to a management controller (MC) and receives control commands from the control interface. In response to receipt of the control command, the decoder circuit decodes the command in order to provide control signals to one or more of a number of serial voltage relays, which are each respectively coupled to the AC outlets. The AC switch utilizes the decoder circuit to respectively configure the serial voltage relays using the control signals. By configuring the serial voltage relays, the MC provides and/or removes respective connections between AC inputs and AC outlets, which selectively activates and/or de-activates respective AC outlets.

In one embodiment, the AC switch is provided within a rack-based IHS that includes the MC and an Infrastructure Module (IM) which communicatively connects the MC to compute nodes and other functional electronic components within the rack-based IHS. The MC enables selective power activation and selective power deactivation of respective electronic components within the rack-based IHS without impacting power supplied to other electronic components within the rack-based IHS.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The illustrative embodiments provide a power switching system, a method, and an information handling system (IHS) that enables selective activation and de-activation of respective alternating current (AC) outlets of a plurality of AC outlets within an AC switch. The AC switch includes a decoder circuit that is communicatively coupled via a control interface to a management controller (MC) and receives control commands from the control interface. In response to receipt of the control command, the decoder circuit decodes the command in order to provide control signals to one or more of a number of serial voltage relays, which are each respectively coupled to the AC outlets. The AC switch utilizes the decoder circuit to respectively configure the serial voltage relays using the control signals. By configuring the serial voltage relays, the MC provides and/or removes respective connections between AC inputs and AC outlets, which selectively activates and/or de-activates respective AC outlets.

In one embodiment, the AC switch is provided within a rack-based IHS that includes the MC and an Infrastructure Module (IM) which communicatively connects the MC to compute nodes and other functional electronic components within the rack-based IHS. The MC enables selective power activation and selective power deactivation of respective electronic components within the rack-based IHS without impacting power supplied to other electronic components within the rack-based IHS.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Further, those of ordinary skill in the art will appreciate that the hardware components and basic configuration depicted in the various figures (e.g., FIG. 1) and described herein may vary. For example, the illustrative components within IHS 100 (FIG. 1) are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

Figure 1:
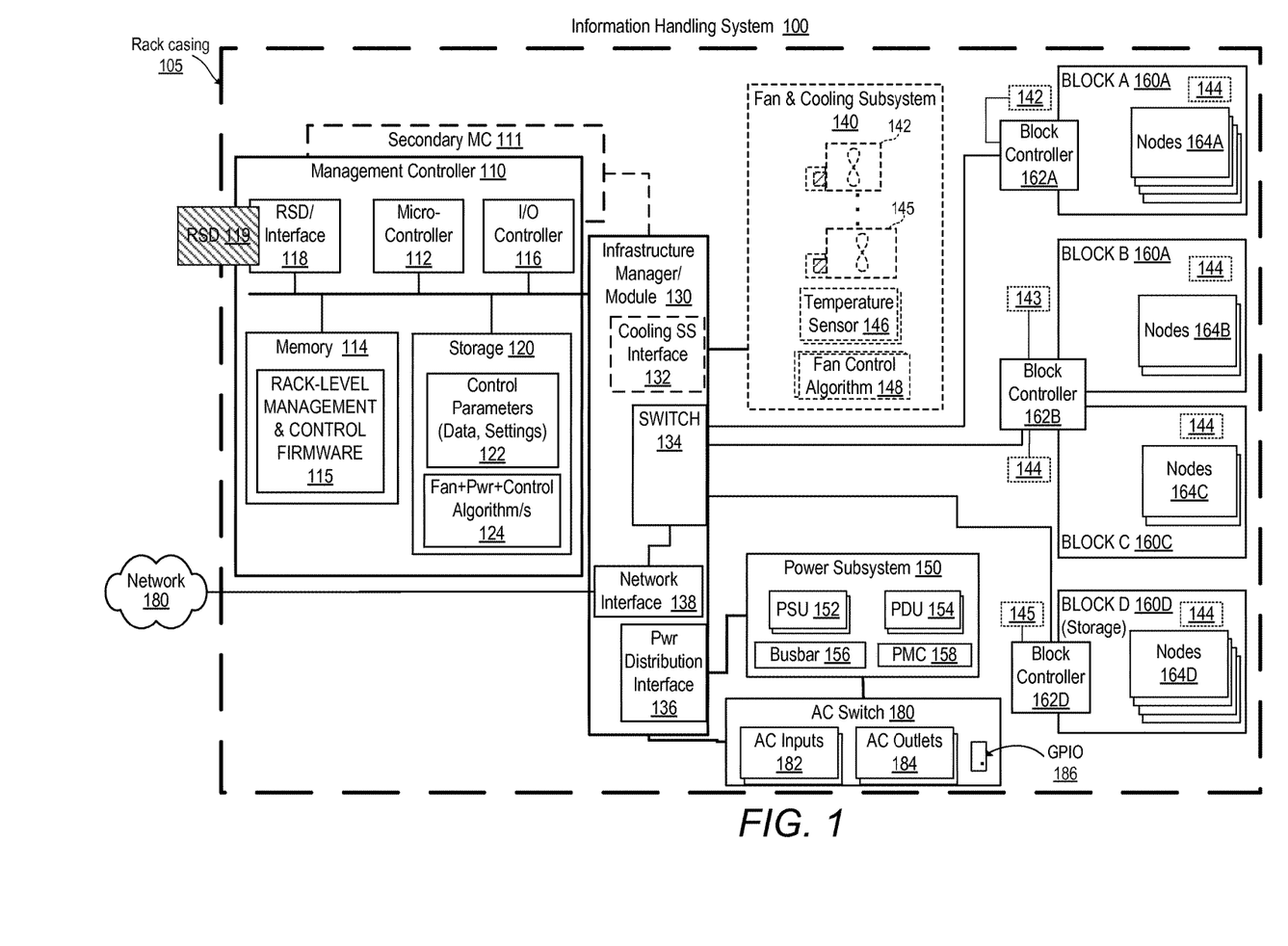
FIG. 1 illustrates an example information handling system (IHS) having an alternating current (AC) switch, within which various aspects of the disclosure can be implemented, according to one or more embodiments.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, there is illustrated a two-dimensional block diagram of an example rack-based IHS 100 configured as a modular, expandable rack with modular configuration of various functional components inserted therein. As a two-dimensional image, certain of the presented components are shown in different orientations relative to each other for simplicity in describing the connectivity of the components. For example, while certain components are shown separate from the power sub-system, in actual implementation, these components can be located on or within the power bay housing several of the components of the power sub-system. Similarly, while the power subsystem is shown with specific components within a single block, each of these components is not necessarily contained in a unitary structure. For example, the bus bar can be modularly extended along the entire vertical run of the rack with only one sub-section in connection with the actual power bay. For purposes of the disclosure all general references to an information handling system shall refer to the rack-level IHS 100, while references to actual processing nodes within the IHS 100 shall be referenced as chassis level processing nodes or IT gear. It is further appreciated that within the rack-based IHS 100 can be implemented separate domains or systems that are independent of each other and can be assigned to different independent customers and/or users. However, this level of detail of the actual use of the processing nodes within the general rack-level IHS 100 is not relevant to the descriptions provided herein and are specifically omitted.

As presented in FIG. 1, IHS 100 comprises rack casing 105, which can comprise one or more panels of sheet metal or other material interconnected to form a three dimensional component generally referred to as a rack in the industry. Unique aspects of the rack casing 105, which add to the modularity and expandability of IHS 100 are further illustrated and described in one or more of the three-dimensional figures presented herein. As is further presented by these three-dimensional figures, certain components indicated herein are located internal to the rack casing 105 while other components are located external to rack casing 105. These various components are communicatively connected to one or more components via power and communication cables, which are generally represented via the connecting lines of FIG. 1. IHS 100 comprises a hierarchical arrangement of multiple management modules, along with power and cooling components, and functional processing components or IT gear within end nodes. At the rack level, IHS 100 includes management controller (MC) 110 communicatively connected to infrastructure manager/module (IM) 130. MC 110 includes a microcontroller 112 which is coupled via an internal bus to memory 114, I/O interface controller 116, removable storage device (RSD) interface 118 and storage 120. Memory 114 can be flash or other form of memory. Illustrated within memory 114 is rack-level management and control (RMC) firmware 115, which is inclusive of the firmware that controls the operation of MC 110 in communicating with and managing the down-stream components of IHS 100. I/O interface controller 116 provides connection points and hardware and firmware components that allow for user interfacing with the MC 110 via one or more connected I/O devices, such as a keyboard, a mouse, and a monitor. I/O interface controller 116 enables a user to enter commands via, for example, a command line interface (CLI) and to set operating parameters for IHS 100, among other supported user inputs, and to view status information of IHS 100. RSD interface 118 enables insertion or connection of a RSD 119, such as an SD card containing pre-programmable operating firmware for IHS 100. In at least one embodiment, a RSD 119 stores a copy of the operating parameters of IHS 100 and the stored operating parameters can be utilized to reboot the IHS 100 to its operating state following a system failure or maintenance shutdown. Storage 120 can be any form of persistent storage and can include different types of data and operating parameters (settings) 122 utilized for functional operation of IHS 100. Among the stored content within storage 120 can also be algorithms 124 for fan and/or power and/or control. In one or more embodiments, IHS 100 can optionally include at least one other MC, illustrated as secondary MC 111, to provide a redundant configuration of MCs 110/111 which are both simultaneously active and functioning. With these embodiments, the redundant configuration enables IHS 100 to continue operating following a failure of either of the MCs 110/111 or in the event one of the MCs 110/111 has to be taken offline for maintenance.

Infrastructure manager 130 includes cooling subsystem interface 132, Ethernet switch 134, power distribution interface 134 and network interface 138. Network interface 138 enables IHS 100 and specifically the components within IHS 100 to connect to and communicate with or via an external network 180.

In addition to the above described MC 110 and IM 130, IHS 100 further comprises cooling subsystem 140, power subsystem 150, and a plurality of processing blocks 160, individually labeled as blocks A-D 160A-160D, each having an associated block controller (BC) 162. Cooling subsystem 140 includes a plurality of fan modules of which a first fan module 142 and a second fan module 145 are shown. These fan modules 142, 145 are located within a respective fan bay (not shown) and can be different sizes and can provide different sizes and numbers of fans per module. One or more aspects of the modularity of the cooling subsystem and particularly the fan modules are presented within the descriptions which follow, with reference to one or more of the three-dimensional figures. Also included within cooling subsystem 140 is a plurality of temperature sensors 144, which are further shown distributed within blocks 160. Cooling subsystem of IHS 100 further includes some design features of rack casing 105, such as perforations for air flow and other design features not expanded upon within the present description. As alluded to by the dashed boxes representing the individual fan modules 142-145, each fan module 142-145 is located behind (or in the air flow path of) a specific block 160 and the module 142-145 is communicatively coupled to and controlled by the block controller 162 associated with that block 160. Within each block 160 is at least one, and likely a plurality of processing/functional nodes 164. As one aspect of the disclosure, the number of nodes per block can vary up to a maximum number based on the block dimension and size of each node. These nodes can be synonymous with the chassis or the individual processing units themselves. Also, as shown with blocks B 160B and C 160C, a single block controller 162B can be assigned to control multiple blocks, when the number of nodes within the blocks does not exceed a pre-established BC threshold. In at least one implementation, the BC threshold can be set to 16 nodes. Each node controlled by a respective BC 162 is communicatively coupled to that BC 162 via one or more cables.

Switch 134 enables MC 110 to communicate with block controllers 162 via a network of Ethernet cables 170. Specifically, according to at least one embodiment, MC 110 provides certain control and/or management signals to BCs 162 via one or more select wires within the Ethernet cables 170, which select wires are additional wires not being utilized for general system and network communication.

Power subsystem 150 generally includes a plurality of power supply units (PSUs) 152, one or more power distribution units (PDU) 154, and a modular busbar 156. Power subsystem 150 also includes a source of external power (not shown). Each of the individual nodes and other components within IHS 100 that require power are either directly coupled to modular busbar 156 or coupled via power cables to PDUs to obtain power. As one aspect of power distribution within IHS 100, MC 110 can monitor power consumption across the IHS 100 as well as the amount of available power provided by the functional PSUs 152 and trigger changes in power consumption at the block level and ultimately at the node level based on changes in the amount of available power and other factors. Control of the power subsystem 150 can, in one embodiment, be provided by a separate power controller (or power module controller) 158, separate from and communicatively connected to MC 110. As further illustrated, one additional aspect of the power system for IHS 100 provide for the inclusion of AC switch 180. AC switch 180 is communicatively coupled to both IM 130 and power subsystem 150. AC switch 180 includes a plurality of AC inputs 182 and a plurality of AC outlets 184 that are utilized to supply power to the PSUs 152 and other functional components of IHS 100 that require AC power. Other features and functionality of IHS 100 will be described in greater detail hereafter with reference to specific ones of the following figures.

Figure 2:
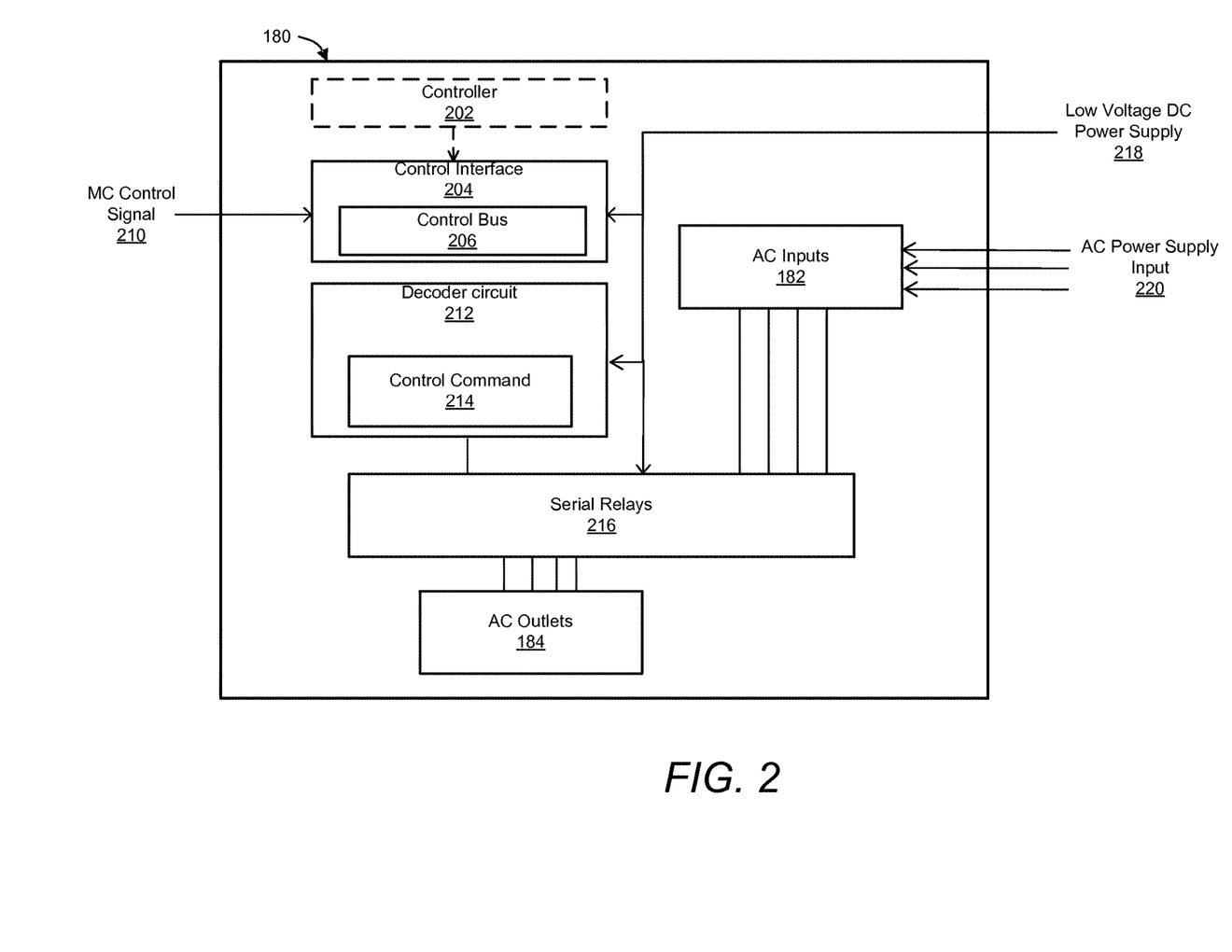
FIG. 2 illustrates a block diagram of an AC switch, in accordance with one or more embodiments.

FIG. 2 illustrates a block diagram of component makeup of AC switch 180, in accordance with one or more embodiments. AC switch 180 operates as a power switching component for an IHS, such as IHS 100, that has multiple components which require AC electrical power. AC switch 180 includes a control interface 204, which further includes digital control bus 206. In one embodiment, digital control bus 206 enables remote control of and/or access to AC switch 180 by a host agent or management controller 110. Digital control bus 206 can be implemented using any one of various types of buses including an inter-integrated circuit (I2C) bus. In one embodiment, AC switch 180 can optionally include local controller module (or controller) 202, which can provide several of the power control features described herein as being provided by MC 110. AC switch 180 further includes decoder circuit 212. Illustrated within decoder circuit 212 is control command 214, which is representative of a control message that decoder circuit 212 receives from control interface 204. Additionally, AC switch 180 comprises AC inputs 182, AC outlets 184, and serial voltage relays 216. AC switch 180 can be configured to provide as many AC inputs and/or AC outlets as are required to power the various electronic components of IHS 100. In one embodiment, GPIO and isolation component 186 (FIG. 1) provides an expansion capability within AC switch 180 by which AC inputs 182 and/or AC outlets 184 can be efficiently added or removed to satisfy the power requirements of the various electronic components of IHS 100. Each of serial voltage relays 216 is coupled between an AC input 182 and a corresponding AC outlet 184, respectively, such that each AC outlet 184 can be switched on and off. Also illustrated within FIG. 2 are low voltage DC power supply input 218 and AC power supply input 220. As one aspect of the disclosure, low voltage DC power supply input 218 (e.g., a 12V DC input) is used to bias the decoder circuit (212) and the serial voltage relay (216).

ACS 180 selectively activates and de-activates respective alternating current (AC) outlets based on and/or responsive to control commands received via control interface 204 from management controller (MC) 110 (FIG. 1). MC 110 determines whether to perform at least one of (a) selective activation or (b) selective de-activation of respective AC outlets 184. AC switch 180 utilizes decoder circuit 212 to individually control activation of any specific AC outlet 184. In particular, decoder circuit 212 decodes the received control command 214 in order to generate and provide control signals to one or more of a number of serial voltage relays 216 respectively coupled to the AC outlets 184. AC switch 180 utilizes the decoder circuit 212 to respectively configure the targeted one or more serial (high) voltage relays 216 using the control signals. More specifically, the decoder circuit 212 accepts the control command from the digital control bus, decodes the command, and controls the intended outlets through respective serial voltage relays. By configuring the serial voltage relays into one of an open circuit state and a closed circuit state, MC 110 is able to selectively activate and/or de-activate respective AC outlets 184.

Figure 3:
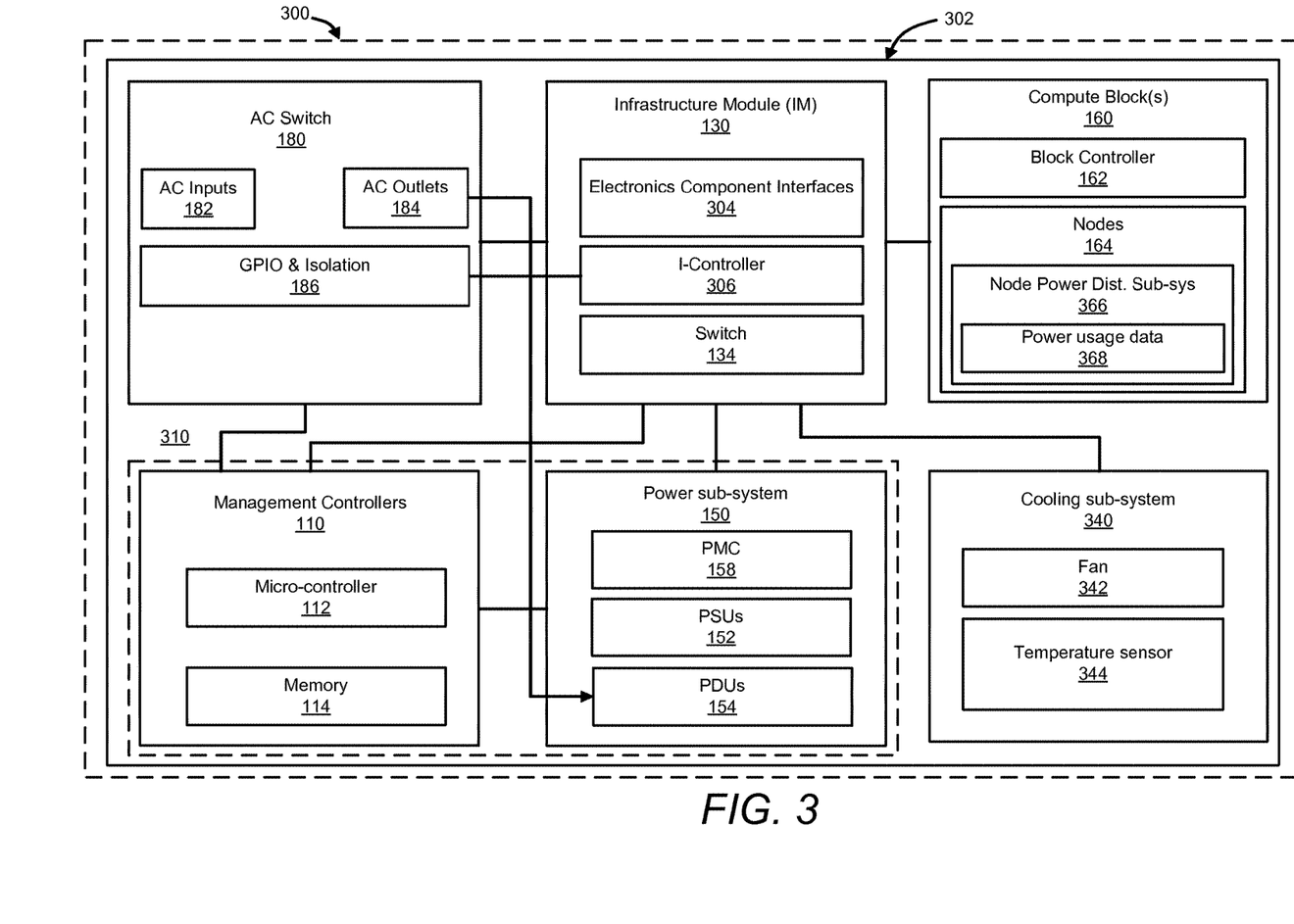
FIG. 3 illustrates a block diagram of a rack-based IHS having an AC switch and other associated electronic equipment, in accordance with one or more embodiments.

FIG. 3 illustrates a block diagram of an AC switch 180 and other associated electronic equipment within a second representation of an example rack-based IHS, in accordance with one or more embodiments. Rack-based IHS 300 comprises rack casing 302 in which various electronic components of rack-based IHS 300 are positioned, relative to a specific one or more of the other electronic components. Rack-based IHS 300 also comprises AC switch 180 and Infrastructure Module/Manager (IM) 130, which is communicatively coupled to AC switch 180. In addition, rack-based IHS 300 comprises management controller(s) 110 and power sub-system 150. In one embodiment, MC 110 is included within power bay 310 along with power sub-system 150.

AC switch 180 comprises GPIO and Isolation component 186, AC inputs 182 and AC outlets 184. AC switch 180 is communicatively coupled to both IM 130 and power sub-system 150. Power subsystem 150 includes PSUs 152, PDUs 154, and power module controller (PMC) 158. AC outlets 184 are utilized to supply AC power to the PSUs 152 and other functional components of IHS 300. Illustrated within IM 130 are electronics component interfaces 304, Infrastructure Controller (I-Controller) 306 and switch 134, which is communicatively connected to I-Controller 306. IHS 300 also comprises processing/compute block(s) 160. As illustrated, processing/compute blocks 160 comprise block controllers (BCs) 162 and a plurality of processing nodes 164. Nodes 164 include node power distribution sub-system 366 which includes power consumption and requirements (or power usage) data 368. Also illustrated is cooling sub-system 340 which comprises one or more fans 342 and temperature sensor/s 344.

Figure 4:
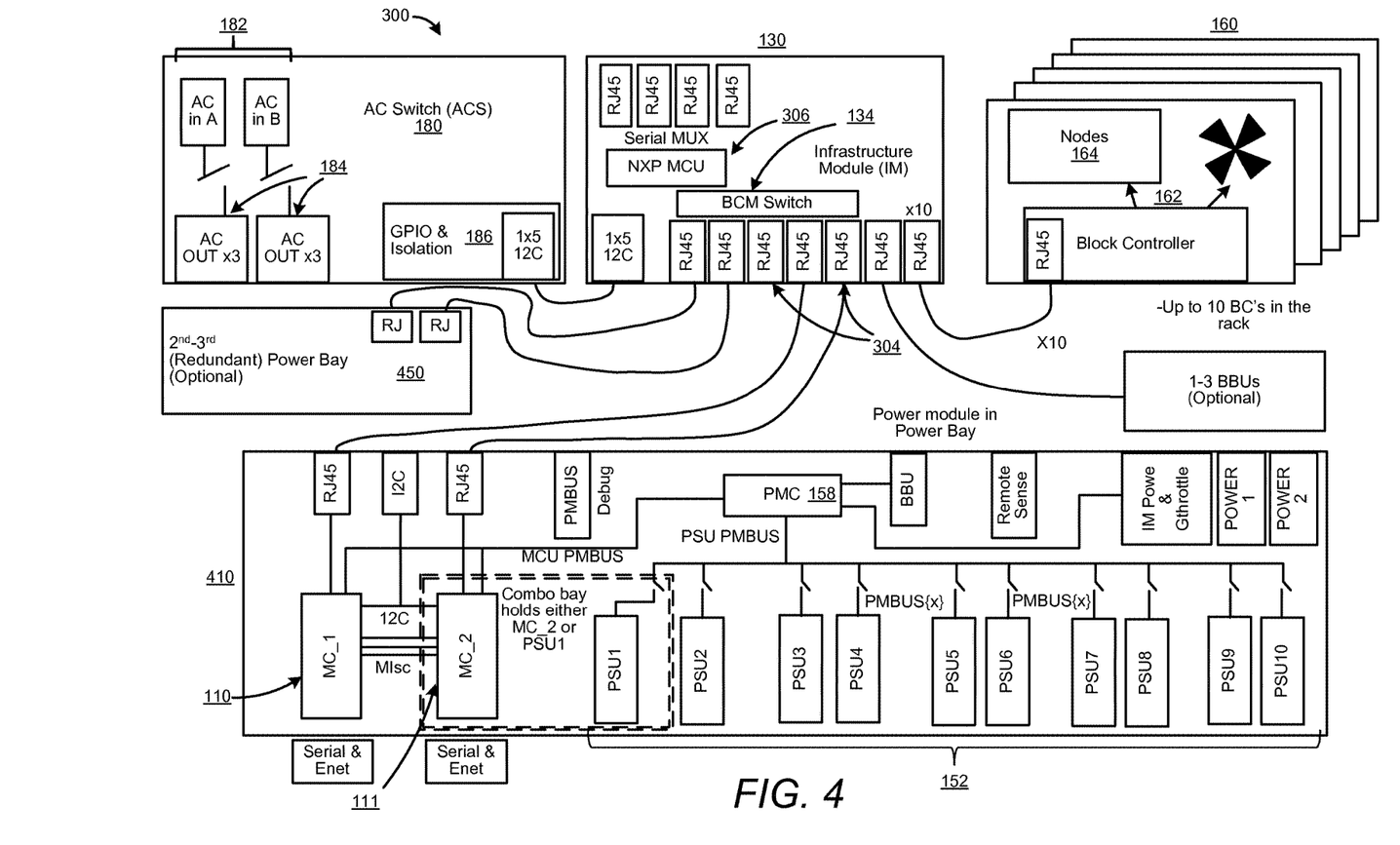
FIG. 4 illustrates further details of the connectivity of functional components within rack-based IHS of FIG. 3, in accordance with one or more embodiments.

FIG. 4 illustrates further details of the connectivity of functional components within rack-based IHS 300, in accordance with one or more embodiments. As with FIG. 3, IHS 300 comprises AC switch 180 and Infrastructure Module (IM) 130, which is communicatively coupled to AC switch 180. In addition, rack-based IHS 300 comprises power bay 410 which further comprises management controllers 110, 111 and power sub-system 150. As illustrated in IHS 300, MC 110 is communicatively connected to IM 130.

Power bay 410 also includes multiple power supply units (PSUs) 152 and a power module controller (PMC) 158 communicatively connected to each of the ten PSUs 152. Power bay 410 provides regulated power to various functional electronic components within IHS 300. While ten (10) PSUs 152 are shown, a different number of PSUs 152 can be used within power bay 410. PMC 158 coordinates the operation, timing and communications of functional components within power bay 410. As illustrated, PMC 158 is further communicatively connected to MCs 110 and 111. MCs 110 and 111 can receive power supply and settings data 368 (FIG. 3) from/about PSUs 152 via PMC 158.

Power bay 410 receives a source of AC power for the PSUs 152 from AC switch 180. AC switch 180 comprises AC input terminal(s) 182 and AC output terminals 184. Each AC outlet has a respective AC power plug of a corresponding electronic component inserted therein. AC switch 180 includes a GPIO interface 186 that is communicatively connected to IM 130.

In one embodiment, IHS 300 includes at least one other secondary power bay 450 to provide a redundant power bay for supplying and regulating power within IHS 300. Having a redundant power bay 450 enables IHS 300 to continue operating following a power failure associated with power bay 410 or in the event that one of power modules is taken offline for maintenance purposes.

MC 110 provides system-level management and control for the functional electronic components. In particular, MC 110 provides power distribution management using AC switch 180. Based on power supply, consumption/requirements, and settings data corresponding to the associated functional electronic components, MC 110 determines whether to perform at least one of selective activation and selective de-activation of respective AC outlets.

In one embodiment, MC 110 receives power supply and power settings data 368 associated with PSUs 152 from PMC 158. In one or more embodiments, the power supply, consumption/requirements and settings data associated with PSUs 152 can be respectively mapped to individual functional electronic components within IHS 300. For example, within each of compute/processing blocks 160 are at least one, and likely a plurality of processing/functional nodes, such as nodes 164, which are generally referred to herein as processing nodes. Each processing node 164 contains a node power distribution sub-system 366 (FIG. 3) that receives and controls power distributed to nodes 164. The node power distribution sub-systems 366 respectively receive power from PSUs 152. In one embodiment, each of the node power distribution subsystems 366 track and record power usage data and settings 368 for each of the processing nodes 164.

In response to determining that the received power consumption/requirement information indicates that an activation/deactivation of at least one AC outlet is expected, MC 110 sends a control command to AC switch 180 in order to perform AC outlet activation and/or de-activation. AC switch 180 utilizes control command to configure serial voltage relays which selectively activates and/or de-activates respective AC outlets. In particular, AC switch 180 activates an AC outlet by providing a first control signal to a serial voltage relay to provide a power signal closed connection path between an AC input and a corresponding AC outlet. Similarly AC switch 180 de-activates an AC outlet by providing a second control signal to a serial voltage relay to provide an open circuit between an AC input and a corresponding AC outlet. In one embodiment, the first control signal is substantially identical to the second control signal and the serial voltage relay operates like a switch that is toggled from a first state (e.g., an open circuit state) to second opposing state (e.g., a closed circuit state) and vice versa, whenever a control signal is received.

Figure 5:
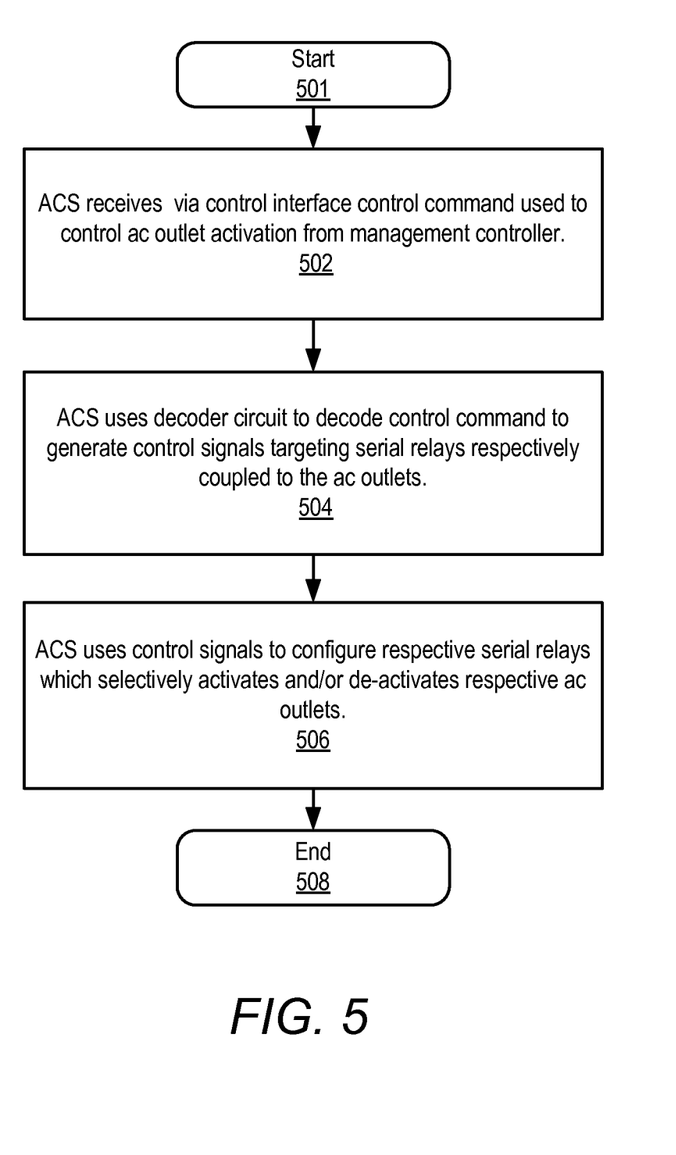
FIG. 5 is a flow chart illustrating a method for selectively activating and de-activating AC outlets within an AC switch, in accordance with one or more embodiments.
Figure 6:
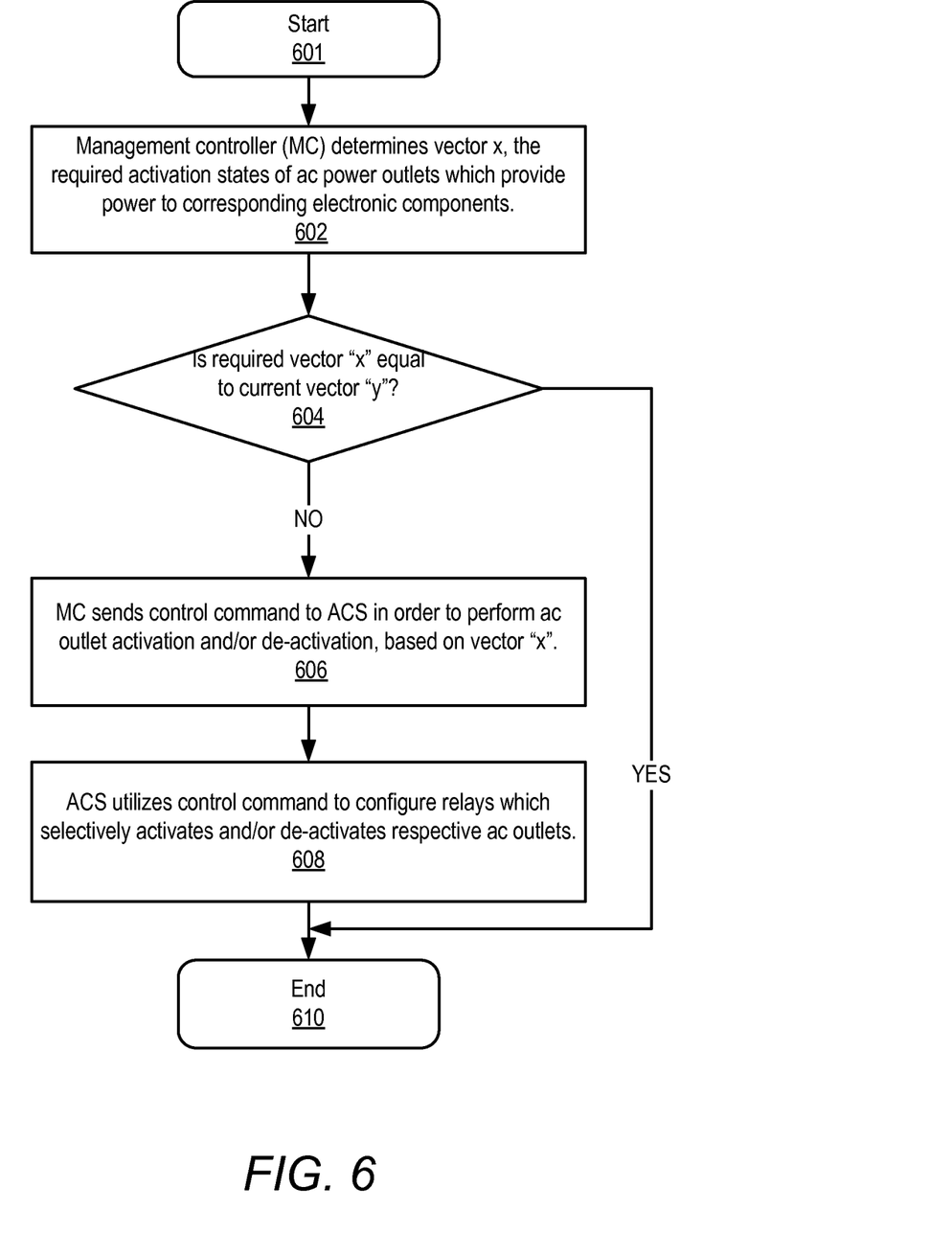
FIG. 6 is a flow chart illustrating a method for selectively activating and de-activating AC outlets within a rack-based IHS, using a rack-level management controller, in accordance with one or more embodiments.

FIGS. 5 and 6 present flowcharts illustrating example methods by which IHS 100 and/or MC 110 and specifically AC switch 180 presented within the preceding figures performs different aspects of the processes that enable one or more embodiments of the disclosure. Generally, method 500 and method 600 collectively represent methods for selectively activating and de-activating respective alternating current (AC) outlets, using control commands received from a management controller within IHS 100. The description of each method is provided with general reference to the specific components illustrated within the preceding figures. Generally each method is described as being implemented via execution of rack-level management and control firmware 115 within MC 110. It is, however, appreciated that certain aspects of the described methods may be implemented via other processing devices and/or execution of other code. In the discussion of FIGS. 5 and 6, reference is also made to elements described in FIG. 1-FIG. 4.

FIG. 5 illustrates a first example method within IHS 100 and/or AC switch 180 for selectively activating and de-activating respective alternating current (AC) outlets using control commands received at a control interface. Method 500 begins at the start block 501 and proceeds to block 502 where AC switch 180 receives, from management controller (MC) 110 via a control interface, a control command associated with AC outlet activation. At block 504, AC switch 180 utilizes the decoder circuit to decode the control command in order to generate control signals targeting serial voltage relays respectively coupled to the AC outlets. At block 506, AC switch 180 uses control signals to configure respective serial voltage relays and the resulting configured serial voltage relays selectively activate and/or de-activate respective AC outlets. The process ends at block 508.

FIG. 6 illustrates a first example method within IHS 100 and/or MC 110 for selectively activating and de-activating respective alternating current (AC) outlets within AC switch 180. Method 600 begins at the start block 601 and proceeds to block 602 where (system) management controller (MC) 110 determines vector x, which is the required activation states of AC power outlets that provide power to corresponding electronic components within IHS 100/300. In one embodiment, MC 110 determines "x" the required activation states of AC power outlets in AC switch 180 by analyzing power supply/consumption and settings data 368 associated with various functional electronic components of IHS 100/300. This data 368 is received from PMC 158. At decision block 604, MC 110 determines whether required vector "x" is equal to the current vector "y". If at decision block 604, MC 110 determines that required vector "x" is not equal to the current vector "y", MC 110 sends a control command to AC switch 180 in order to perform AC outlet activation and/or de-activation, based on vector "x", as shown at block 606. At block 608, AC switch 180 utilizes control command to appropriately configure serial voltage relays, which selectively activates and/or de-activates respective AC outlets. However, if at decision block 604, MC 110 determines that required vector "x" is equal to the current vector "y", MC 110 does not send a control command to AC switch 180, and the process ends, as shown at end block 610.

In the above described flow charts, one or more of the methods may be embodied in a computer readable device containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A power switching system comprising:
at least one AC input;
a plurality of alternating current (AC) outlets providing an AC power supply for respective power supply units (PSUs) and other functional components of an information handling system that require AC power;
a controller module comprising a control interface that receives control commands from a system management controller, wherein the control interface includes a digital control bus and is powered using at least one low voltage direct current (DC) power supply that is independent from the AC power, wherein the controller module selectively provides at least one of (a) activation of AC outlets and (b) de-activation of AC outlets, from among the plurality of AC outlets based on one or more control commands received from the system management controller, wherein the system management controller determines which of the plurality of AC outlets to activate and de-activate by determining required activation states of AC power outlets in the AC switch by analyzing power supply, power consumption and device settings data associated with the electronic components;
a plurality of serial voltage relays, each serial voltage relay respectively coupled between an AC input and a corresponding AC outlet; and
a decoder circuit communicatively coupled to the controller module and which:
receives the control command from the controller module;
decodes the control command to determine which of the plurality of AC outlets to activate and de-activate; and
transmits an individual signal to each serial voltage relay connected to an AC outlet that is targeted for one of activation and de-activation;
wherein the at least one low voltage DC power supply provides a voltage input that is used to bias the decoder circuit and each serial voltage relay of the plurality of serial voltage relays; and
wherein the power switching system is communicatively coupled to both an infrastructure module and a power subsystem that includes a plurality of power supply units (PSUs), power distribution units (PDUs), and a power control module (PMC).

2. The power switching system of claim 1, wherein the controller module selectively activates AC outlets from among the plurality of AC outlets via a switchable circuit connection provided by a corresponding serial voltage relay.

3. The power switching system of claim 2, wherein:
the decoder circuit is a single decoder circuit that is connected to each serial voltage relay and communicatively connected to the controller module, which provides the control commands to the decoder circuit.

4. The power switching system of claim 1, wherein:
the control interface enables remote access to at least one of a host agent and the system management controller.

5. The power switching system of claim 1, wherein:
the power system is included within a power bay of a rack-based IHS of functional electronic components;
the plurality of AC outlets are utilized to provide power to the functional electronic components; and the controller module enables selective power activation and selective power deactivation of respective electronic components within the rack-based IHS without impacting power supplied to other electronic components within the rack-based IHS.

6. The power switching system of claim 1, wherein the controller module further determines which of the plurality of AC outlets to activate and de-activate by:
  determining a required vector, which is the required activation states of AC power outlets that provide power to corresponding electronic components; and
  sending a control command to an AC switch in order to perform AC outlet activation and/or de-activation, based on the determined required vector.

7. The power switching system of claim 1, wherein in determining which of the plurality of AC outlets to activate and de-activate, the controller module:
  determines whether the required vector is equal to a current vector; and
  sends the control command with the new vector in response to determining that the required vector is not equal to the current vector.

8. An information handling system comprising:
  a plurality of functional electronic components requiring a supply of alternating current (AC) power and each having an AC power plug;
  a management controller (MC) that provides system-level management and control for the functional electronic components; and
  an AC power switching system communicatively coupled to both an infrastructure module and a power subsystem that includes a plurality of power supply units (PSUs), power distribution units (PDUs), and a power control module (PMC), the AC power switching system comprising:
    at least one AC input;
    a plurality of AC outlets having one AC power plug of a corresponding electronic component inserted therein;
    a control interface that receives control commands from the MC, the control interface including a digital control bus and is powered using at least one low voltage direct current (DC) power supply that is independent from the AC power supply and provides a voltage input that is used to bias the decoder circuit and each of the plurality of serial voltage relays, wherein the MC utilizes the control commands to selectively provide at least one of (a) activation of AC outlets and (b) de-activation of AC outlet, from among the plurality of AC outlets, wherein the MC determines whether to perform at least one of selective activation and selective de-activation of respective AC outlets, wherein to determine which of the plurality of AC outlets to activate and de-activate comprises the MC determining required activation states of AC power outlets in the AC switch by analyzing power supply, power consumption and device settings data associated with the electronic components, the power consumption and device settings data being associated with the PSUs and received from the PMC;
    a plurality of serial voltage relays respectively coupled between a corresponding AC input and each respective AC outlet; and
    a decoder circuit communicatively coupled to the control interface and which:
      receives the control command from the MC;
      decodes the control command to determine which of the plurality of AC outlets to activate and de-activate; and
      transmits a signal to each serial voltage relay connected to an AC outlet that is targeted for one of activation and de-activation.

9. The IHS of claim 8,
  wherein the controller module selectively activates AC outlets from among the plurality of AC outlets via a switchable circuit connection provided by a corresponding serial voltage relay.

10. The IHS of claim 8, wherein:
  the decoder circuit is connected to each serial voltage relay and communicatively connected to the control interface;
  wherein the MC provides a control command to the decoder circuit to control respective activation and deactivation of each one of the plurality of AC outlets via each respective serial voltage relay.

11. The IHS of claim 8, wherein the control interface:
  provides remote control access to at least one of a host agent and the management controller.

12. The IHS of claim 8, further comprising:
  an Infrastructure Module (IM) which communicatively connects the at least one MC to other functional electronic components; and
  a power bay which includes the at least one MC and a power management controller which is coupled to the at least one MC;
  wherein the IHS is a rack-based IHS; and
  wherein the MC enables selective power activation and selective power deactivation of respective electronic components within the rack-based IHS without impacting power supplied to other electronic components within the rack-based IHS.

13. The IHS of claim 8, wherein the MC further determines which of the plurality of AC outlets to activate and de-activate by:
  determining a required vector, which is the required activation states of AC power outlets that provide power to corresponding electronic components; and
  sending a control command to an AC switch in order to perform AC outlet activation and/or de-activation, based on the determined required vector.

14. The IHS of claim 8, wherein in determining which of the plurality of AC outlets to activate and de-activate, the MC:
  determines whether the required vector is equal to a current vector; and
  sends the control command with the new vector in response to determining that the required vector is not equal to the current vector.

15. In a power switching system, a method comprising:
  receiving from a management controller (MC), via a control interface, a control command used to control AC outlet activation and AC outlet de-activation within a power switching system which includes: a plurality of AC outlets having one AC power plug of a corresponding electronic component inserted therein; and the control interface that receives control commands from the MC, the control interface including a digital control bus and is powered using at least one low voltage direct current (DC) power supply that is independent from the AC power supply, the at least one low voltage DC power supply providing a voltage input that is used to bias the decoder circuit and each of the plurality of serial voltage relays, wherein the MC utilizes the control commands to selectively provide at least one of (a) activation of AC outlets and (b) de-activation of AC outlet, from among the plurality of AC outlets, wherein the MC determines whether to perform at least one of selective activation and selective de-activation of respective AC outlets;

wherein to determine which of the plurality of AC outlets to activate and de-activate, the MC determines required activation states of AC power outlets in the AC switch by analyzing power supply, power consumption and device settings data associated with the PSUs and which can be respectively mapped to individual electronic components, the power supply, power consumption and device settings data received via a power management controller;

forwarding the control command to a decoder circuit, wherein the decoder circuit is a single circuit that is coupled to a plurality of serial voltage relays and decodes the control command to provide control signals to the serial voltage relays respectively coupled to a plurality of AC outlets; and configuring the serial voltage relays using respective control signals, wherein said configuring selectively provides at least one of (a) activation of AC outlets and (b) de-activation of AC outlet, from among the plurality of AC outlets.

16. The method of claim 15, further comprising:

receiving control commands from the MC, wherein the MC determines whether to perform at least one of selective activation and selective de-activation of respective AC outlets; and enabling remote control access to at least one of a host agent and the MC.

17. The method of claim 15, wherein:

the power system is included within a rack-based IHS of compute nodes and other functional electronic components, wherein the MC enables selective power activation to and selective power deactivation from respective electronic components within the rack-based IHS without impacting power supplied to other electronic components within the rack-based IHS.

18. The method of claim 15, further comprising determining which of the plurality of AC outlets to activate and de-activate by:

determining a required vector, which is the required activation states of AC power outlets that provide power to corresponding electronic components; and sending a control command to an AC switch in order to perform AC outlet activation and/or de-activation, based on the determined required vector.

19. The method of claim 18, wherein determining which of the plurality of AC outlets to activate and de-activate comprises:

determining whether the required vector is equal to a current vector; and sending the control command with the new vector in response to determining that the required vector is not equal to the current vector.

* * * * *